United States Patent [19]

Bernstein et al.

[11] Patent Number: 4,608,331

[45] Date of Patent: Aug. 26, 1986

[54] PHOTOSENSITIVE PLATES WITH DIAZONIUM COMPOSITION LAYER AND POLYURETHANE PHOTOPOLYMER WITH UNSATURATION IN SIDE CHAIN OVERLAYER

[75] Inventors: Carl Bernstein, Deerfield; Konstantinos Arvanitis, Roselle; Luigi Amariti, Bloomingdale, all of Ill.

[73] Assignee: Witco Chemical Corporation, New York, N.Y.

[21] Appl. No.: 672,296

[22] Filed: Nov. 16, 1984

[51] Int. Cl.[4] .......................... G03C 1/54; G03C 1/70
[52] U.S. Cl. ...................................... 430/156; 430/175; 430/284; 430/287; 430/906; 522/90
[58] Field of Search ............... 430/156, 284, 287, 906; 204/159.16, 159.19, 159.22

[56] References Cited

U.S. PATENT DOCUMENTS

| | | | |
|---|---|---|---|
| 3,043,807 | 7/1962 | Snyder et al. | 528/65 |
| 3,462,267 | 8/1969 | Giangualano et al. | 430/156 |
| 3,586,507 | 6/1971 | Burnett | 430/156 |
| 3,655,625 | 4/1972 | Thomas | 430/156 |
| 3,660,097 | 5/1972 | Mainthia | 430/175 |
| 3,776,889 | 12/1973 | Pande et al. | 525/59 |
| 3,783,152 | 1/1974 | Larsen | 560/26 |
| 3,808,004 | 4/1974 | Thomas et al. | 430/156 |
| 3,864,133 | 2/1975 | Hisamatsu et al. | 430/906 |
| 3,905,815 | 9/1975 | Bonham | 430/156 |
| 3,936,530 | 2/1976 | Morgan | 430/275 |
| 3,948,665 | 4/1976 | Richter et al. | 430/271 |
| 4,049,634 | 9/1977 | Ko et al. | 204/159.22 |
| 4,139,436 | 2/1979 | Jasani | 204/159.16 |
| 4,210,713 | 7/1980 | Sumiyoshi et al. | 204/159.19 |
| 4,233,390 | 11/1980 | Jargiello | 430/156 |
| 4,289,838 | 9/1981 | Rowe et al. | 430/175 |
| 4,296,190 | 10/1981 | Hasegawa et al. | 430/57 |
| 4,316,949 | 2/1982 | Petrellis et al. | 430/156 |
| 4,337,307 | 6/1982 | Neubauer | 430/175 |
| 4,408,532 | 10/1983 | Incremona | 430/175 |
| 4,486,526 | 12/1984 | Thomas et al. | 430/156 |

FOREIGN PATENT DOCUMENTS 1274017  5/1972  United Kingdom ............... 430/156

*Primary Examiner*—Charles L. Bowers, Jr.
*Attorney, Agent, or Firm*—Lockwood, Alex, FitzGibbon & Cummings

[57] ABSTRACT

Photopolymeric polyurethanes are provided which have a polymeric backbone including recurring urethane or urea groups or both and which have unsaturated hydrocarbon groups attached to this backbone. These photopolymers are combined with a solvent and have a selected and controlled molecular weight and viscosity. The photopolymeric polyurethane solutions are especially useful in providing plates that have a layer including a photopolymer, particularly plates for printing or photoresists that have a photopolymeric layer over a layer of light sensitive diazonium composition.

10 Claims, No Drawings

PHOTOSENSITIVE PLATES WITH DIAZONIUM COMPOSITION LAYER AND POLYURETHANE PHOTOPOLYMER WITH UNSATURATION IN SIDE CHAIN OVERLAYER

BACKGROUND AND DESCRIPTION OF THE INVENTION

This invention generally relates to photosensitive polyurethane materials, more particularly to polyurethane solutions that are photosensitive or photopolymerizable when subjected to actinic radiation of the type that is utilized for exposing lithographic plates, photoresists and the like. The polyurethane photopolymers include recurring urethane groups, urea groups or combinations thereof in its backbone, and unsaturated hydrocarbon groups such as allyl groups are attached to the backbone, preferably through an ether linkage. Polyurethane photopolymers according to this invention are coated from a solvent system, and their molecular weight and viscosity are preferably controlled by selective reaction of a diamine with terminal —NCO groups.

Plates, especially those used for lithographic or planographic printing procedures, generally comprise a plate base or support member, a sub-base coating and a photosensitive coating. The plate base typically is a flexible sheet such as paper, metal, polymer film or the like which is treated, if necessary, with a suitable sub-base coating to provide a hydrophilic surface to which one or more photosensitive coatings are applied. Various plates, including lithographic printing plates, photoresists, and other articles having a substrate and one or more photosensitive layers thereover, have been devised over the years.

When the photosensitive layer is negative working, it becomes insolubilized upon imagewise exposure to actinic radiation. After such imagewise exposure, the plate is developed, whereupon the unexposed, unreacted portion of the imagewise exposed material is removed, and the hydrophilic sub-base material is uncovered at these locations. Since the exposed locations are insolubilized, they are not removed by the developer, and since they are oleophilic they readily receive and hold ink and readily transfer the ink as a printed image to a surface such as paper. The greater the abrasion resistance of the photosensitized material, the greater the number of times the ink can be transferred to the surface being printed, particularly in high-speed presses and the like that subject the developed plates to severe conditions.

Certain photopolymers are known to provide plates having enhanced abrasion resistance when compared with other, more sensitive materials such as diazonium compositions. Particularly important in the development of this technology is United States Letters Pat. No. 3,808,004, which discloses various photosensitive cinnamoylated photopolymer coatings which are especially suitable for use as a coating over a diazonium compound layer on a plate such as a lithographic plate or a photoresist for making printed circuit boards and the like. Photopolymers disclosed in that patent include a polyurethane cinnamate photopolymer for making presensitized, negative-working lithographic printing plates, such polyurethane resin having phenol blocking groups attached by a thermally unstable linkage that permits unblocking when desired.

One particular advantage of polyurethane materials is that they are especially abrasion resistant because they are both tough and flexible. Many polyurethanes, however, are unsuitable as photopolymers on a commercial scale because they possess virtually no or very limited photoreactivity properties or have a photospeed that is slower than desired for many applications.

Typically, a plate that has especially high abrasion resistance, such as one including a polyurethane, suffers from requiring a relatively long imagewise exposure time to adequately carry out the desired photoreaction in order to provide an exposed plate that is readily and effectively developable. An acceptable photospeed is important for all plates, including those having an exceptionally long run life, which is on the order of 250,000 impressions. Accordingly, there is a need for a photopolymer and a presensitized photopolymer plate coated therewith which exhibit acceptable photospeed when used in combination with a sensitizer such as a diazonium composition.

We have discovered that such a presensitized photopolymer plate is provided when the plate includes a photopolymeric composition having a polyurethane photopolymer with a polymeric backbone including recurring urethane and/or urea groups, which photopolymer has unsaturated hydrocarbon groups attached to the backbone. In an especially important aspect of this invention, the unsaturated hydrocarbon group is an allyl group, and the photopolymer is a polyurethane having pendant allyl groups attached to the polymeric backbone through an oxygen atom or ether linkage. In another important aspect of this invention, the photopolymer is in a solvent system, and its viscosity and molecular weight are controlled by reacting terminal —NCO groups of the polyurethane backbone with, if necessary, a diamine and/or a diol to chain extend and then a monoamine and/or a monoalcohol to provide a photopolymer that has substantially no terminal —NCO groups and that will not further chain extend to increase in viscosity and molecular weight.

It is accordingly a general object of this invention to provide a presensitized photopolymeric plate having an exceptionally long run life.

Another general object of the present invention is to provide, as a solution, a polyurethane photopolymer having reactive pendant groups and that has a selectable and controllable molecular weight and viscosity.

Another object of this invention is to provide an improved photopolymer which has a polyurethane backbone and, prior to photopolymerization, pendant groups that are especially reactive whereby the photopolymer is photopolymerized by actinic radiation of the type used for imagewise exposure of plates, including lithographic or planographic plates and photoresists such as those incorporated in the making of printed circuit boards and the like.

Another object of the present invention is to provide an improved presensitized photopolymeric plate that has adequate photospeed while possessing exceptional abrasion resistance by providing an exterior coating that is both tough and elastomeric.

Another object of the present invention is to provide an improved presensitized photopolymeric plate having a run life on the order of 250,000 copies or more.

These and other objects of the present invention will be apparent from the following detailed description of this invention.

Photopolymers according to this invention are generally classifiable as polyurethanes inasmuch as the backbone includes urethane groups and often also urea groups, which groups are recurring units within the polymer backbone. The photopolymer includes pendant or extra-linear reactive groups that depend from the backbone. As such, the photopolymer can be generally characterized as a polyurethane having pendant reactive groups. With more particular reference to the pendent reactive groups, such include unsaturated hydrocarbon moieties that are attached to the polyurethane backbone, preferably by means of an ether linkage.

The photopolymer according to this invention results from reacting a polyester, polyether, polyesteramide, polycaprolactone or polyacrylate module with an —NCO group of a diisocyanate compound and reacting an unsaturated ether compound with the other —NCO group of the diisocyanate compound. Typically, one of the -NCO groups reacts with an hydroxy group of the polymeric module, and the other —NCO group of the diisocyanate reacts with an hydroxy group of the unsaturated ether compound.

While plates according to this invention can be made from these photopolymers when they are prepared as polyurethane elastomers in a non-solvent system in accordance with United States Letters Pat. No. 3,043,807 and are subsequently coated from a solvent system, the photopolymers according to this invention are preferably prepared in a solvent environment. When the polyurethanes for providing plates according to this invention are prepared in a non-solvent system, such polyurethane elastomers, usually when in solid form, are put into solution with an appropriate solvent system for coating onto an appropriately treated or coated plate base.

In an especially important aspect of this invention, the photopolymer is prepared within a solvent system, most advantageously the solvent system from which the photopolymer will be coated onto the plate. In this regard, usually a prepolymer is first made and then added to a solvent system, unless the prepolymer itself had been prepared in a solvent system. Typically after chain extension by a diamine and/or a diol, a monoamine and/or a monoalcohol is then added to this prepolymer solution in order to permit reaction between the monoamine and free —NCO groups of the prepolymer in order to thereby substantially prevent further chain extension of the prepolymer backbone so that the molecular weight and viscosity of the resulting photopolymer solution is controlled at a selected level.

More particularly, the polyurethane photopolymer having unsaturated hydrocarbon groups attached to its backbone preferably is prepared by providing an hydroxy terminated module having the general formula HO—R—OH, wherein R is a polyester, a polyether, a polyesteramide, a polycaprolactone or a polyacrylate, this polymeric module being reacted with a diisocyanate of the general structure OCN—R'—NCO, wherein R' is a hydrocarbon that may include aromatic or non-aromatic structures, preferably aromatic structures. Such diisocyanate structure is further reacted with a dihydroxy compound having an unsaturated pendent group, whereby the isocyanate groups couple an hydroxy group of the polymeric module with an hydroxy group of the unsaturated dihydroxy compound. The dihydroxy compound having an unsaturated group has the general structure

wherein R" is a non-aromatic or aromatic hydrocarbon. R''' is an unsaturated hydrocarbon of from about 2 to about 18 carbon atoms in length, and, when R" and the unsaturated hydrocarbon are to be joined together through an ether linkage, R''' is an unsaturated hydrocarbon of about 2 to 18 carbon atoms that has a terminal oxygen atom.

The resulting polymer, which has been found to be advantageously photopolymeric, includes a polyurethane backbone having recurring urethane groups, urea groups or combinations thereof and having spaced along the backbone and pendant to the backbone unsaturated hydrocarbon groups that are attached to the backbone. The spacing between the unsaturated ether pendant groups can be generally consistent if the polymer is made in a controlled manner, or the spacing can be varied if the polymer is formulated under random polymerization conditions. Generally speaking, the random polymerization will occur when the polyester type of or hydroxy-terminated polymeric module the diisocyanate and the unsaturated ether compound are generally simultaneously reacted together to form a prepolymer, while the structured type of polymer could be prepared by first reacting the hydroxy-terminated polymeric module with the diisocyanate in order to form an isocyanate-terminated prepolymer, after which the dihydroxy unsaturated compound would be joined to the free —NCO group of the isocyanate-terminated prepolymer.

It is important that the diisocyanate be added in excess when forming the prepolymer solution so that all of the hydroxyl groups of the polyester type of module and of the dihydroxy unsaturated compound react with the —NCO groups of the diisocyanate in order to form a polymer having a controlled molecular weight and having terminal —NCO groups.

Further regarding the addition of the amine and/or alcohol composition to the prepolymer in order to react with the terminal —NCO groups of the prepolymer, when desired, this addition can be a two-stage procedure, the first stage resulting in chain extension in order to increase the molecular weight and viscosity of the photopolymer to desired levels. Such chain extension will occur when the amine is a diamine and/or when the alcohol is a diol, which should be added very slowly in order to increase the viscosity and molecular weight as needed, at which time a monoamine and/or a monoalcohol is added as a second stage in order to react with and cap off the terminal —NCO groups to thereby prevent further chain extension by, for example, the presence of water within the polyurethane system.

In the hydroxy-terminated polymeric module, HO—R—OH, R is a polyester, a polyether, a polyesteramide, a polycaprolactone or a polyacrylate, and this polymeric module has terminal hydroxy groups as indicated by its formula. Each such hydroxyy-terminated polymeric module should have a molecular weight in the general range of between about 500 and about 7,000, typically between about 700 and 1,500.

The polyesters, containing hydroxyl groups, in the sense of the invention are, for example, reaction products of dihydric alcohols with dibasic carboxylic acids. Instead of the free dicarboxylic acids, the corresponding dicarboxylic acid anhydrides or corresponding dicarboxylic acid esters of lower alcohols or mixtures thereof can also be used for the preparation of polyester-polyols. The dicarboxylic acids can be of an aliphatic, cycloaliphatic, aromatic and/or heterocyclic nature and can optionally be substituted, for example by halogen atoms. Examples of these are: oxalic acid, malonic acid, succinic acid, adipic acid, suberic acid, azelaic acid, sebacic acid, phthalic acid, terephthalic acid, isophthalic acid, trimellitic acid, phthalic anhydride, tetrahydrophthalic anhydride, hexahydrophthalic anhydride, tetrachlorophthalic anhydride, endomethylenetetrahydrophthalic anhydride, glutaric anhydride, maleic acid, maleic anhydride, and fumaric acid. Dihydric alcohols which can be used, optionally mixed with one another, are, for example, ethylene glycol, propylene 1,2-glycol and propylene 1,3-glycol, butylene 1,4-glycol and butylene 1,3-glycol, hexane-1,6-diol, octane-1,8-diol, neopentylglycol, cyclohexanedimethanol, thiodiglycol, diethylene glycol, triethylene glycol, tetraethylene glycol, polyethylene glycol, dipropylene glycol, polypropylene glycols, dibutylene glycol and polybutylene glycols. Exemplary preferred polyester-type modules of this type include poly(1,6-hexane adipate/isophthalate), poly(1,6-hexane/ adipate), the condensation product of adipic acid and ethylene glycol, and the condensation product of adipic acid, ethylene glycol and propylene glycol-1,2.

Polycaprolactones containing terminal hydroxyl groups, in the sense of the invention are, for example, included in those polyesters which are prepared by the polymerization of a lactone, for example of $\epsilon$-caprolactone, or by the condensation of a hydroxycarboxylic acid, for example of $\omega$-hydroxycaproic acid, with a starting material containing hydroxyl groups.

Representative polyether-type modules include polyethers made from ethylene oxides, propylene oxides, butylene oxides, tetrahydrofuran, and mixtures thereof. Representative polyacrylate-type modules include dihydroxy functional acrylic copolymers. Exemplary polyesteramides are made by replacing small amounts of the diols used in making the polyesters described herein with compounds such as ethanol amine, isopropanol amine, ethylene diamine, and 1,6-hexamethylene diamine.

Various diisocyanates that are suitable for use in preparation of the polymer according to this invention include the toluene diisocyanates such as 2,4-toluene diisocyanate and 2,6-toluene diisocyanate, 4,4'-tolidine diisocyanate, 4,4'-diphenylenemethane diisocyanate, 4,4'-cyclohexylmethane diisocyonate, 4,4'-diphenylmethane diisocyanate, m-phenylene diisocyanate, 4-chloro-1,3-phenylene diisocyanate, 4,4'-tetramethylene diisocyanate, 1,6-hexamethylene diisocyanate, 1,10-decamethylene diisocyanate, 1,4-cyclohexylene diisocyanate, 4,4'-methylene bis (cyclohexylisocyanate), 3,3'-dimethyl-4,4'-diphenylmethane diisocyanate and 1,5-tetrahydronaphthalene diisocyanate and mixtures of such diisocyanates.

Unsaturated dihydroxy compounds suitable for use in connection with this invention include glycerol-alpha-allyl ether, trimethylolpropane mono allyl ether, pentaerythritol diallyl ether, erytherol, glycerol-mono-allyl ether, allyl ethylene glycol, allyl propylene glycol, bis hydroxyethyl allyloxy succinate, vinyl cyclohexane diol, N,N-di(hydroxyethyl) allyl carbamate, dihydroxyethyl ether of 2-allyl hydroquinone; 2,2'-diallyl P,P' bisphenol.

Resulting polyurethane photopolymer solutions prepared by reacting these components have an unsaturated, pendant group for each molecular weight increment of between about 500 and 7,000 molecular weight. These polyurethane photopolymers have a total calculated molecular weight of on the order of approximately 50,000 to approximately 250,000 after addition, in solution, of the amine composition.

Plates according to this invention include a plate base or support member, which is typically a flexible sheet such as paper, metal, polymer film or the like, which has a surface having a layer and/or treatment that renders the plate base or support member more suitable for use as a plate, such as rendering it more hydrophilic. Coated thereover is a photosensitive system including one or mor layers of materials that are readily photopolymerizable or photolyzable in response to actinic radiation. In the preferred aspects of the present invention, such sensitizer system is a coating that includes a diazonium resin or condensate that is overcoated with the polyurethane photopolymer solution in accordance with this invention. Stabilizers and/or accelerators and other well-known components may be included within the sensitizer system in order to increase the shelf stability and/or to enhance the initial reactivity of the system to actinic radiation.

The present invention is especially suitable and finds particularly advantageous utility when the support member or plate base is anodized aluminum. In accordance with known techniques, an anodized aluminum plate base is brush grained or otherwise suitably treated to improve its ability to bond with a sub-base coating thereover and then washed to remove oils and contaminants which may be present on the surface thereof after such operations. Various sub-base coating materials are available, including phytic acid, melamine-formaldehyde resin condensates overcoated with polyacrylamide and thereafter treated with zirconium acetate. Other sub-base coatings include urea-formaldehyde, titanium orthoesters, silane-acrylics and silicate sub-bases such as those described in United States Letters Pat. No. 2,714,066. In addition, other sub-bases which are typically used on plates include gelatin, polyacrylic acid and water soluble salts thereof, polymethacrylic acid and water soluble salts thereof, carboxymethyl cellulose, carboxymethyl hydroxyethyl cellulose, certain titanates, modified resins of urea-formaldehyde and melamine-formaldehyde, polyvinyl alcohols, ferrocyanides, bichromates of sodium, potassium and ammonium, and oxides of the metal forming the plate, as well as combinations thereof and other sub-base materials.

Diazonium materials included within the sensitizing system according to this invention will typically be diazonium resins or diazonium condensates. Known diazonium materials include condensation products of an aldehyde with a diazonium compound having an amine substituent such as, for example, a water-soluble condensation product of para-diazo diphenyl amine and formaldehyde, these materials typically being furnished as salts, for example zinc chloride salts. Suitable is a diazonium mixed condensate prepared by condensing one mole of 3-methoxy-diphenylamine-4 -diazonium sulfate with one mole of 4,4'-bismethoxymethyl diphenylether in an 85% concentration of phosphoric acid which is isolated as mesitylene sulfonate.

Other diazo compounds which can be used include the diazo oxides such as pyrido [1 2-a]benzimidazol-8-yl3 (4H)-diazo-4 (3H)-oxo-1-naphthalene sulfonate.

Diazonium compounds which can also be used include such materials as
4'-bromo-diphenylamine-4-diazonium chloride;
4'-chlorodiphenylamine-4-diazonium chloride;
4-methoxydiphenylamine-4-diazonium chloride;
3'-methoxydiphenylamine-4-diazonium chloride;
3'-propoxy-diphenylamine-4-diazonium chloride;
X,X$_1$,X$_2$-tribromodiphenyl-amine-4-diazonium chloride;
4'-methyldiphenylamine 4-diazonium chloride;
4'-hydroxyldiphenylamine-4-diazonium chloride;
4'-benzoylaminodiphenylamine-4-diazonium chloride;
4'-fluoro-diphenylamine-4-diazonium chloride;
2-anilidosulfonyldiphenyl-amine-4-diazonium chloride;
2-(p-toluene-sulfonyl-amino)-diphenylamine-4-diazonium chloride;
p-diazo-N-ethyl-N-benzyl aniline½ ZnCl$_2$;
4'-diazo-2-chloro-N,N'-diethylaniline-½ ZnCl$_2$;
and other similar and well known diazonium materials.

The polyurethane photopolymer composition is typically laid down as a photosensitive overlayer on the diazonium resin coating, such polyurethane photopolymer being laid down from a solvent system in which the polyurethane photopolymer is included at a concentration of between approximately 0.005 weight percent up to about 5 weight percent. The bulk of the polyurethane photopolymer composition includes one or more solvents such as toluene, cyclohexanone, xylene, isopropanol, ethyl acetate, methyl ether ketone, diglyme (diethylene glycol dimethyl ether), ethyl diglyme, and the like. Photoaccelerators, pigments, oxidation retardants and photochromic dyes may be included as desired in order to enhance the ability of the photopolymer to absorb actinic energy and photoreact.

EXAMPLE 1

A polyurethane photopolymer solution was prepared. First, 100 parts of poly(1,6-hexane adipate/isophthalate), which had an hydroxyl number of 73, and 15 parts of glycerol alpha allyl ether were allowed to react at 100oC. for 4 hours together with 91 parts of methylene bis (4-cyclohexylisocyanate). The resulting prepolymer had a free —NCO value of 6.9. A solvent mixture of 25 percent toluene, 15 percent xylene and 60 percent isopropanol was added to prepare a solution having a 20 percent solids content. To this prepolymer solution, 27 parts of 3-amino-methyl-3,5, 5-trimethyl cyclohexylamine were added and thoroughly mixed to react with 94 percent of the available —NCO value. This solution had a viscosity (at 25° C.) of between 10,000 and 20,000 cps. The polyurethane photopolymer of this solution had one unsaturated (allyl) group for each 1,800 molecular weight.

EXAMPLE 2

A polyurethane prepolymer solution was prepared by reacting the following at 74oC for 5 hours: 100 parts of poly(1,6-hexane/adipate), having a molecular weight of about 1000 and an hydroxyl number of 112, 25.9 parts of glycerol alpha allyl ether, 138.6 parts of ethyl acetate, and 82.1 parts of 4,4'-diphenylmethane diisocyanate. The resulting prepolymer had a free —NCO value of 0.83. A solvent mixture of 60 percent ethyl acetate and 40 percent methyl ethyl ketone was added to make a final solution containing 25 percent solids. Added thereto with good mixing were 5.5 parts of 3-aminomethyl-3,5,5-trimethyl cyclohexylamine, which reacted with 95 percent of the available —NCO value, and 0.4 part of diethanol amine was added to react with 5 percent of the available —NCO value. The final polyurethane photopolymer solution had a viscosity at 25° C. of between 5,000 and 15,000 cps and exhibited one unsaturated group for each 1,000 of molecular weight.

EXAMPLE 3

100 parts of poly(1,6-hexane/adipate), hydroxyl number of 112, 25.9 parts of glycerol alpha allyl ether, and 77.5 parts of toluene were allowed to react at 100° C. for 4 hours with 55.9 parts of a mixture of 80 parts of 2,4-toluene diisocyanate and 20 parts of 2,6-toluene diisocyanate to yield a polyurethane prepolymer solution having a free —NCO value of 0.88. A solvent mixture of 15 percent toluene, 35 percent ethyl acetate and 50 percent methyl ethyl ketone was added to prepare a final solution containing 25 percent solids. Added with good mixing to this prepolymer solution were 3.2 parts of 3-amino methyl-3,5,5-trimethyl cyclohexylamine to react with 90 percent of the available -NCO value, and 0.3 part of diethanolamine was added to react with the remaining 10 percent of the available -NCO value. The resulting polyurethane photopolymer solution had a viscosity at 25° C. of between 5,000 and 15,000 cps and exhibited one unsaturated group for each 1050 molecular weight.

EXAMPLE 4

Photopolymer polyurethane solutions generally prepared in accordance with Example 2 were used to make coatable pigment dispersions for preparing lithographic plates. A total of 6 grams of the polyurethane photopolymer solution was combined with 1.5 grams of the pigment Phthalocyanine (duPont) and 92.5 grams of cyclohexanone, this coating dispersion having been ball milled for about 24 hours to provide stable dispersions that were coated by a whirler coater at about 100 RPM onto anodized aluminum plates that had been presensitized with a 3 percent solution of p-diazo-diphenylamine-formaldehyde condensate. After exposure and development by 3-M plate developer (Minnesota Mining and Manufacturing Corporation), the background was clean. Accelerated press tests provided 55,000 acceptable impressions, whereas a heavy duty plate made in accordance with U.S Pat. No. 3,808,004 gave 40,000 acceptable impressions. The particular accelerated press tests utilized correspond to run lives of approximately 165,000 and 120 000, respectively.

EXAMPLE 5

A polyurethane photopolymer solution was prepared by reacting 496.5 parts of poly(1,6-hexane/adipate) having a molecular weight of about 1,000, 100.3 parts of glycerol alpha allyl ether, and 356.25 parts of 4,4'-diphenyl methane diisocyanate. The free —NCO value was 0.85. With good mixing, to this prepolymer solution was added 3-amino-methyl-3,5,5-trimethyl cyclohexylamine to react with 93 percent of the available —NCO value, after which diethanol amine was added to react with 7 percent of the available —NCO value. The final solution had a viscosity of 7500 cps at 25° C. and on unsaturated group for each 1250 molecular weight.

The resulting polyurethane photopolymer solution was coated onto a base plate of anodized aluminum that had been previously coated with a sensitizing solution including 3 percent by weight of a diazo condensate. Upon development, the plate was found to be acceptable in terms of background, developability and sharpness. The polyurethane photopolymer coatin solution included 92.5 weight percent of cyclohexanone, 6 percent of the polyurethane photopolymer solution, and 1.5 weight percent of a pigment.

EXAMPLE 6

Polyurethane prepolymer solution was prepared from 500 parts of a 1,000 molecular weight poly(1,6-hexane/ adipate), 174 parts of trimethylolpropane monoallyl ether and 419 parts of 4,4'-diphenyl methane diisocyanate. A solvent mixture of 60 percent ethyl acetate and 40 percent methyl ethyl ketone was added to provide a final solution containing 25 percent solids. Added to this prepolymer solution with good mixing was 3-aminomethyl-3,5,5-trimethyl cyclohexylamine to reac 95 percent of the —NCO value (0.79 as measured) in order to provide the desired viscosity, after which diethanolamine was added to react with the remaining 5 percent of the available —NCO value. The thus prepared polyurethane photopolymer solution included on unsaturated group per 1050 molecular weight.

A polyurethane photopolymer coating dispersion was made by mixing 12 grams of this polyurethane photopolymer solution (25 percent solids) with 81 grams of cyclohexanone and 7 grams of Phthalocyanine pigment (10 percent in cyclohexanone), and this polyurethane photopolymer coating dispersion was coated onto a base plate of anodized aluminum coated with a 3 percent water solution of a diazo condensate. The plate developed satisfactorily after exposure to actinic light.

EXAMPLE 7

A polyurethane photopolymer coating dispersion was prepared by blending 6 percent of the polyurethane photopolymer solution of Example 6 with 15 percent of a pigment having 10 percent solids, 79 percent of cyclohexanone, and 0.3 percent of a photochromic dye. An anodized aluminum base plate was coated with a sensitizer composition includin9 1.5 wei9ht percent of a diazonium condensate, 7.5 wei9ht percent of dyphylline, 1 percent of zinc chloride, and 90 percent water. The thus sensitized plate was coated with the polyurethane photopolymer coatin9 dispersion. This plate was found to have an acceptable shelf life. After ima9ewise exposure, the plate was developed with a developer includin9 54 percent water and 46 percent solvents to provide a 9ood visible ima9e providin9 a solid step of 6 upon an exposure of 40 BAU.

EXAMPLE 8

A plate sensitizer of the following composition wa coated onto a treated anodized aluminum plate: 285 grams of a diazo condensate, 1425 grams of dyphylline, 190 grams of zinc chloride, 9.5 grams of Surfynol 85 surfactant, and 17,100 grams of water. A polyurethane photopolymer coating dispersion was coated thereover, the photopolymer dispersion including 33.33 grams of the polyurethane photopolymer solution prepared in Example 6, 262.5 grams of cyclohexanone, 37.5 grams of a pigment, and a photochromic dye. The resulting plates were developed with a developer including 54 percent water and 46 percent organic solvents and tested on a press under accelerated conditions to provide an accelerated run length of 40,000, which generally designates an actual press run life of approximately 120,000 copies.

EXAMPLE 9

Aluminum plates were coated with a sensitizing composition including 95.62 weight percent water, 2.0 weight percent of methane sulfonic acid, 0.833 weight percent of zinc oxide, 1.5 weight percent of Diazon 7, and 0.05 weight percent of Surfynol 465. Coated over the resulting diazo layer was a polyurethane polymer coating dispersion including cyclohexanone, photochromic dye, and the polyurethane photopolymer solution prepared in Example 6.

The resulting plate was subjected to imagewise exposure for 25 seconds and developed with a developer including 56 percent water, the developed plate exhibiting a solid step 5. Substantially identical plates were developed with a plate developer that was primarily a mixture of approximately 60 percent n-propyl alcohol and 40 percent water, resulting in a plate exhibiting a solid step of approximately 7 after between 10 and 20 seconds of exposure.

Plates prepared in accordance with this Example were subjected to accelerated press tests and gave approximately 90,000 impressions prior to initial deterioration based upon a half tone dot analysis. This corresponds to an expected actual press run length of between about 250,000 and 270,000 impressions.

EXAMPLE 10

A polyurethane photopolymer coating was prepared as follows. 100 parts of poly(ethylene/propylene adipate) having a hydroxyl number of 56, 17.4 parts of trimethylolpropane mono allyl ether and 25.5 parts of toluene diisocyanate were allowed to react at 100oC for 26 hours after which it was permitted to cool. This solid elastomer, which has no urea groups, was cut up and put into solution in a solvent mixture of 60% ethyl acetate and 40% methyl ethyl ketone. The final solution contained 25% solids, had a viscosity at 25oC of between 5,000 and 20,000 cps., and had one unsaturated group per 1550 molecular weight.

EXAMPLE 11

Another polyurethane photopolymer coating was prepared. First, 100 parts of poly(1,4 butane/adipate), hydroxyl number 112, was mixed with 83.75 parts of 4 4'-diphenylmethane diisocyanate. Then the mixture was heated gradually to 80° C. over a period of 2 hours, after which it was permitted to cool. The resulting isocyanate-terminated prepolymer was mixed with 34.8 parts of trimethylolpropane mono allyl ether and 145.7 parts of ethyl acetate and heated at 75° C. for 6 hours. The resulting prepolymer had a free-NCO value of 0.81. Solvents were added to produce a mixture of having 60% ethyl acetate, 40% dimethylformamide and a solids content of 25%. 5.45 parts of 3-amino-3,5,5-trimethyl cyclohexylamine were added with good mixing to react with 96% of the available isocyanate, and 0.35 parts of dibutyl amine was added to react with 4% of the remaining isocyanate content. The final polyurethane photopolymer solution had a viscosity at 25° C. of between 4,000 and 12,000 cps. and exhibited one unsaturated group for each 1050 of molecular weight.

EXAMPLE 12

A polyurethane photopolymer havin9 no urea 9roups can be prepared in solution when 100 parts of poly(ethylene/adipate), havin9 a hydroxyl number of 112, 28.34 parts of vinyl cyclohexane diol, 74.74 parts of 4,4'-diphenylmethane-diisocyanate, 609.2 parts of ethyl acetate and 0.02 9ms of stannous octoate are allowed to react at 75° C for 24 hours. Such a solution contains 25% solids, has a viscosity at 25° C. of between 4000 and 15000 cps., and has one unsaturated 9roup per 1017 molecular wei9ht. The polyurethane photopolymer does not exhibit an ether linkage of the pendent 9roups to the backbone.

EXAMPLE 13

Polyurethane photopolymer prepared from a polyether is prepared by mixing 100 parts of polytetramethylene ether glycol, having a hydroxyl number of 56, with 43.0 parts of 4,4'diphenylmethane diisocyanate. The mixture is heated gradually to 80oC over a period of 2 hours, after which it is permitted to cool. The resulting isocyanate-terminated prepolymer is mixed with 17.4 part of trimethylolpropane mono allyl ether and 107 parts of ethyl acetate and heated at 75° C. for 8 hours. Solvents are added to produce a final mixture of 80% ethyl acetate and 20% dimethyl formamide and a solids content of 25%. Next, 1.93 parts of 1,4-butane diol are added to react with 95% of the available isocyanate at 75oC for 3 hours, after which 0.1 parts of mono ethyl alcohol are added to react with the remaining —NCO groups. The final polyurethane photopolymer solution has a viscosity at 25° C. of between 3,000 and 10,000 cps. and exhibits one unsaturated group for each 1,607 molecular weight.

It will be understood that the embodiments of the present invention which have been described are merely illustrative of a few of the applications of the principles of the present invention. Numerous modifications may be made by those skilled in the art without departing from the true spirit and scope of the invention.

What is claimed is:

1. A photopolymeric plate having a photosensitive coating thereon, comprising:
    a plate base;
    a layer of light sensitive diazonium composition over the plate base; and
    a polyurethane photopolymeric composition over the diazonium composition, said polyurethane photopolymeric composition including a polyurethane photopolymer with a polymeric backbone having recurring groups selected from the class consisting of urethane groups, urear groups, and combinations thereof, said photopolymer further having an alkyl group attached to and pendant to said backbone through an ether linkage, and said polymeric backbone has terminal groups selected from the class consisting of an —NCO group, a reaction product of an —NCO group and an amine, a reaction product of an —NCO group and an alcohol, and combination thereof.

2. The photopolymeric plates according to claim 1, wherein said photopolymer includes the reaction product of an hydroxy terminated polymeric module, a diisocyanate, and a dihydroxy compound having an allye group.

3. The photopolymeric plates according to claim 2, wherein said dihydroxy compound has an ether linkage by which the allye group is attached to the dihydroxy compound.

4. The photopolymeric plates according to claim 1, wherein said photopolymer includes a reaction product of a prepolymer with a reactant component, wherein said prepolymer includes said polymeric backbone that has —NCO terminal groups and wherein said reactant component is said amine, sid alcohol or mixture thereof, and said prepolymer is a reaction product of an a dihydroxy compound having an allye group.

5. The photopolymeric plates according to claim 1, wherein said polyurethane photopolymer is prepared within an organic solvent.

6. The photopolymeric plates according to claim 1, wherein said allyl groups are attached to said backbone through said an ether linkage.

7. The photopolymeric plates according to claim 1, wherein said polyurethane photopolymer is a solvent system reaction product of a prepolymer with reactant component selected from the group consisting of an amine, an alcohol, and mixtures thereof, said prepolymer being an —NCO terminated polyurethane that is a reaction product of:
    (a) an hydroxy terminated polymer having the formula HO—R—OH, wherein R is a polymeric material selected from the class consisting of a polyester, a polyether, a polyesteramide, a polycaprolactone and a polyacrylate;
    (b) an excess of a diisocyanate having the formula OCN—R'—NCO, wherein R' is a hydrocarbon, and
    (c) an unsaturated dihydroxy compound of the formula

wherein R" is a hydrocarbon and wherein R''' is an; and
    wherein said reactant component includes a monoamine, a monoalcohol or mixture thereof that reacts with terminal —NCO groups of said prepolymer to provide a polyurethane photopolymer solution having substantially no terminal —NCO groups and having substantially stable viscosity and molecular weight.

8. The photopolymeric plates according to claim 7, wherein said reactant component is a two-stage component, the first stage of which includes a diamine, a diol or mixture thereof to chain extend the prepolymer and the second stage of which includes a monoamine, a monoalcohol or mixure thereof to prevent further chain extension.

9. The photopolymeric plates according to claim 7, wherein R41 ' is an allyl group that has a terminal oxygen, whereby the allyl group is joined to R" through said ether linkage.

10. The photopolymeric plates according to claim 7, wherein R''' is a group having the structure —0—allyl.

* * * * *

UNITED STATES PATENT AND TRADEMARK OFFICE
CERTIFICATE OF CORRECTION

PATENT NO. : 4,608,331

DATED : August 26, 1986

Page 1 of 2

INVENTOR(S) : Carl Bernstein, Konstantinos Arvanitis and Luigi Amariti

It is certified that error appears in the above-identified patent and that said Letters Patent is hereby corrected as shown below:

Col. 5, line 51, "diisocyonate" should read --diisocyanate--.

Col. 6, line 16, "mor" should read --more--; line 62, "3-methoxy-diphenylamine-4 -diazonium" should read --3-methoxy-diphenylamine-4-diazonium--; lines 67-68, "[1 2-a]benzimidazol-8-yl3" should read --[1,2-a] benzimidazol-8-yl3--.

Col. 7, line 42, "100oC." should read --100$^{\circ}$C.--; line 58, "74oC" should read --74$^{\circ}$C.--.

Col. 8, line 62, "on" should read --one--.

Col. 9, line 2, "coatin" should read --coating--; line 17, "reac" should read --react--; line 21, "on" should read --one--; line 40, "includin9 1.5 wei9ht" should read --including 1.5 weight--; line 41, "wei9ht" should read --weight--; line 44, "coatin9" should read --coating--; line 45, "ima9ewise" should read --imagewise--; line 47, "includin9" should read --including--; line 48, "9ood visible ima9e providin9" should read --good visible image providing--; line 53, "wa" should read --was--.

Col. 10, line 33, "100oC" should read --100$^{\circ}$C.--; line 38, "25oC" should read --25$^{\circ}$C.--; line 45, "4" should read --4,--; line 65, "havin9 no urea 9roups" should read --having no urea groups--; line 67, "havin9" should read --having--.

Col. 11, line 2, "0.02 9ms" should read --0.2 gms--; line 5, "9roup" should read --group--; line 6, "wei9ht" should read --weight--; line 7, "9roups" should

UNITED STATES PATENT AND TRADEMARK OFFICE
CERTIFICATE OF CORRECTION

PATENT NO. : 4,608,331

DATED : August 26, 1986

Page 2 of 2

INVENTOR(S) : Carl Bernstein, Konstantinos Arvanitis and Luigi Amariti

It is certified that error appears in the above-identified patent and that said Letters Patent is hereby corrected as shown below:

read --groups--; line 15, "80oC" should read --80°C.--; line 24, "75oC" should read --75°C.--; line 51, "alkyl" should read --allyl--; line 57, "combination" should read --combinations--; line 61, "allye" should read --allyl--.
      Col. 12, line 3, "allye" should read --allyl--; line 10, "sid" should read --said--; lines 11-12, "a dihydroxy compound having an allye group." should read --hydroxy terminated polymeric module, a diisocyanate, and a dihydroxy compound having an allyl group.--; line 18, delete "an"; line 41, after "an", insert --allyl group--; line 54, "mixure" should read --mixture--; line 57, "R41'" should read --R"'--.

Signed and Sealed this

First Day of September, 1987

Attest:

DONALD J. QUIGG

Attesting Officer

Commissioner of Patents and Trademarks